US007463170B2

(12) United States Patent
Kong et al.

(10) Patent No.: US 7,463,170 B2
(45) Date of Patent: Dec. 9, 2008

(54) METHOD AND SYSTEM FOR PROCESSING MULTI-RATE AUDIO FROM A PLURALITY OF AUDIO PROCESSING SOURCES

(75) Inventors: Hongwei Kong, Denville, NJ (US); Huaiyi (Hanks) Zeng, Red Bank, NJ (US); Nelson Sollenberger, Farmingdale, NJ (US); Li Fung Chang, Holmdel, NJ (US); Taiya Cheng, San Jose, CA (US); Claude Hayek, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/565,414

(22) Filed: Nov. 30, 2006

(65) Prior Publication Data

US 2008/0130917 A1 Jun. 5, 2008

(51) Int. Cl.
*H03M 7/00* (2006.01)

(52) U.S. Cl. .......................................... 341/61; 381/17

(58) Field of Classification Search .................. 341/61, 341/143, 144; 375/340; 381/17, 119; 712/36; 455/99, 3.06, 556.1, 403
See application file for complete search history.

(56) References Cited

U.S. PATENT DOCUMENTS 5,260,704 A * 11/1993 Hustig et al. ................ 341/144
5,644,310 A * 7/1997 Laczko et al. ............... 341/143
6,055,619 A * 4/2000 North et al. ................... 712/36
6,314,330 B1 * 11/2001 Matthews ..................... 700/94
7,233,268 B1 * 6/2007 Lin et al. ...................... 341/61
2005/0201494 A1 * 9/2005 Yoon .......................... 375/340
2005/0278044 A1 12/2005 Chen et al.

FOREIGN PATENT DOCUMENTS

WO WO 2005/098854 10/2005

OTHER PUBLICATIONS

Partial European Search Report corresponding to European Patent Application No. 07012194.4-1224, dated Mar. 31, 2008, 2 pages.

* cited by examiner

*Primary Examiner*—Howard Williams
*Assistant Examiner*—Joseph Lauture
(74) *Attorney, Agent, or Firm*—McAndrews Held & Malloy Ltd.

(57) ABSTRACT

An audio codec in a wireless device may be utilized for up sampling two or more audio signals to a same data sampling rate. Each audio signal, such as digital audio, voice, and polyringer, for example, may be received at one of a plurality of data sampling rates. Audio signals may be equalized and/or compensated with an FIR filter before up sampling or with an IIR filter to reduce overall processing latency. Multiple half-band interpolation operations may perform the up sampling. The first half-band filter may be replaced by an IIR filter to reduce overall processing latency. A gain of the up-sampled data may be adjusted to reduce noise effects. The channels of the up-sampled audio signals may be mixed and later further up sampled for subsequent communication to an output device. The up-sampled mixed audio signals may be down sampled for communication to a Bluetooth radio.

28 Claims, 13 Drawing Sheets

METHOD AND SYSTEM FOR PROCESSING MULTI-RATE AUDIO FROM A PLURALITY OF AUDIO PROCESSING SOURCES

CROSS-REFERENCE TO RELATED APPLICATIONS/INCORPORATION BY REFERENCE

This patent application makes reference to:

U.S. patent application Ser. No. 11/565,342 filed on Nov. 30, 2006;

U.S. patent application Ser. No. 11/565,373 filed on Nov. 30, 2006;

U.S. patent application Ser. No. 11/565,358 filed on Nov. 30, 2006;

U.S. patent application Ser. No. 11/565,591 filed on Nov. 30, 2006; and

U.S. patent application Ser. No. 11/565,576 filed on Nov. 30, 2006;

Each of the above stated applications is hereby incorporated by reference in its entirety.

FIELD OF THE INVENTION

Certain embodiments of the invention relate to processing of audio signals. More specifically, certain embodiments of the invention relate to a method and system for processing multi-rate audio from a plurality of audio processing sources.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may utilize audio coding and decoding (codec) devices that provide appropriate gain, filtering, and/or analog-to-digital conversion in the uplink direction to circuitry and/or software that provides audio processing and may also provide appropriate gain, filtering, and/or digital-to-analog conversion in the downlink direction to the output devices.

As audio applications expand, such as new voice and/or audio compression techniques and formats, for example, and as they become embedded into wireless systems, such as mobile phones, for example, novel codec devices may be needed that may provide appropriate processing capabilities to handle the wide range of audio signals and audio signal sources. In this regard, added functionalities and/or capabilities may also be needed to provide users with the flexibilities that new communication and multimedia technologies provide. Moreover, these added functionalities and/or capabilities may need to be implemented in an efficient and flexible manner given the complexity in operational requirements, communication technologies, and the wide range of audio signal sources that may be supported by mobile phones.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for processing multi-rate audio from a plurality of audio processing sources, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for processing multi-rate audio from a plurality of audio processing sources. Aspects of the invention may comprise an audio coder/decoder (codec) in a wireless device that may be utilized for up-sampling two or more audio signals to a same data sampling rate. Each audio signal, such as digital audio, digital voice, and digital polyringer, for example, may be received at one of a plurality of data sampling rates. The audio signals may be equalized and/or compensated with an FIR filter or an IIR filter before up sampling. Multiple half-band interpolation operations may be utilized to perform the up sampling. A gain of the resulting up-sampled data may be dynamically adjusted, with ramp-up or ramp-down, for example, to reduce noise effects. The left and right channels of the up-sampled audio signals may be mixed and later further up-sampled for subsequent communication to an output device. The up-sampled mixed audio signals may be down-sampled for communication to, for example, a Bluetooth radio.

Figure 1:
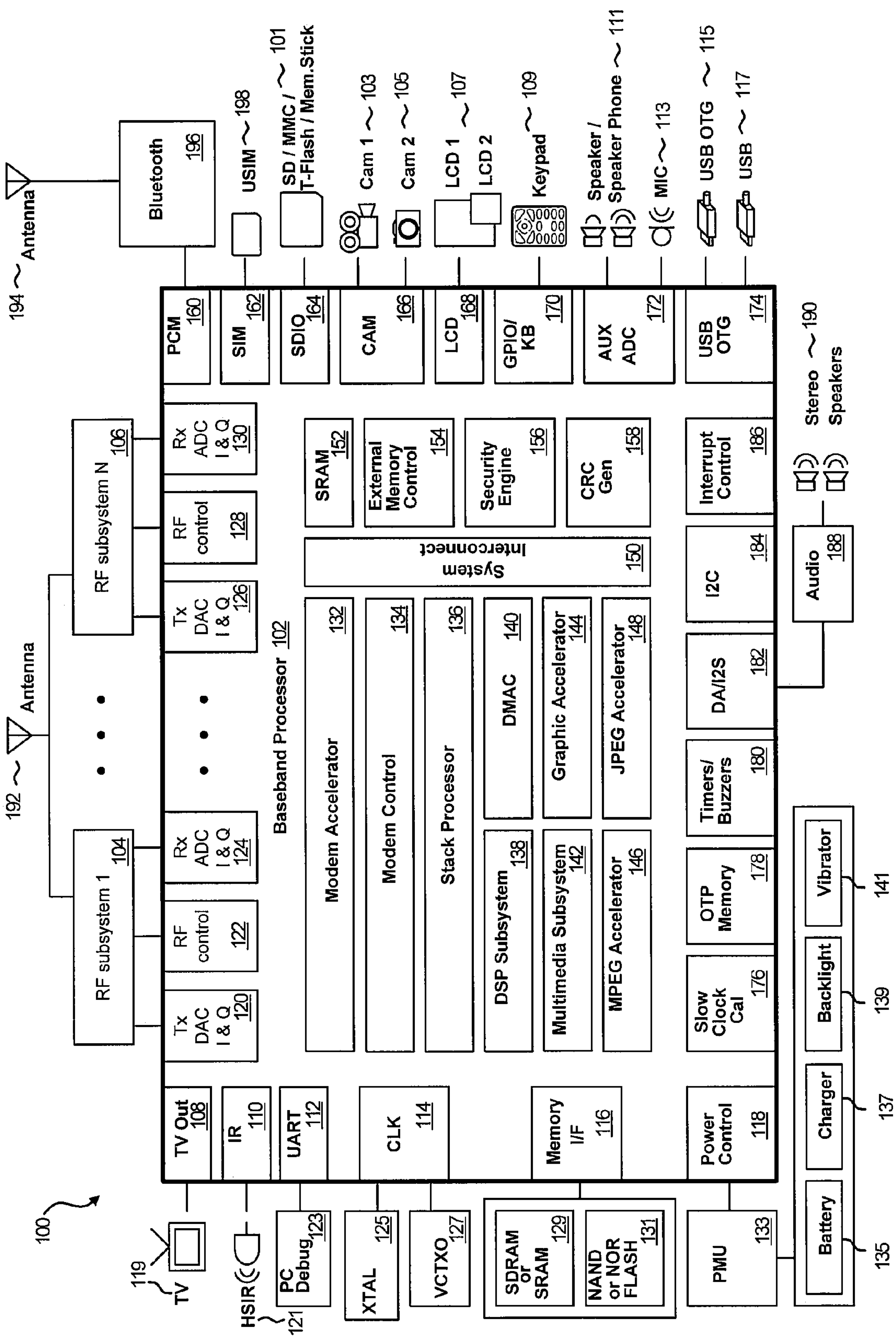
FIG. 1 is a block diagram that illustrates an exemplary multimedia baseband processor that enables handling of a plurality of wireless protocols, in accordance with an embodiment of the invention.

FIG. 1 is a block diagram that illustrates an exemplary multimedia baseband processor that enables handling of a plurality of wireless protocols, in accordance with an embodiment of the invention. Referring to FIG. 1, there is shown a wireless system 100 that may correspond to a wireless handheld device, for example. In this regard, the U.S. application Ser. No. 11/354,704, filed Feb. 14, 2006, discloses a method and system for a processor that handles a plurality of wireless access communication protocols, and is hereby incorporated herein by reference in its entirety. The wireless system 100 may comprise a baseband processor 102 and a plurality of RF subsystems 104, . . . , 106. In this regard, an RF subsystem may correspond to a WCDMA/HSDPA RF subsystem or to a GSM/GPRS/EDGE RF subsystem, for example. The wireless system 100 may also comprise a Bluetooth radio 196, a plurality of antennas 192 and 194, a TV 119, a high-speed infrared (HSIR) 121, a PC debug block 123, a plurality of crystal oscillators 125 and 127, a SDRAM block 129, a NAND block 131, a power management unit (PMU) 133, a battery 135, a charger 137, a backlight 139, and a vibrator 141. The Bluetooth radio 196 may be coupled to an antenna 194. The Bluetooth radio 196 may be integrated within a single chip. The wireless system 100 may further comprise an audio block 188, one or more speakers such as speakers 190, one or more USB devices such as USB devices 117 and 119, a microphone (MIC) 113, a speaker phone 111, a keypad 109, one or more displays such as LCD's 107, one or more cameras such as cameras 103 and 105, a removable memory such as memory stick 101, and a UMTS subscriber identification module (USIM) 198.

The baseband processor 102 may comprise a TV out block 108, an infrared (IR) block 110, a universal asynchronous receiver/transmitter (UART) 112, a clock (CLK) 114, a memory interface 116, a power control block 118, a slow clock block 176, a OTP memory block 178, timers block 180, an inter-integrated circuit sound (I2S) interface block 182, an inter-integrated circuit (I2C) interface block 184, an interrupt control block 186. The baseband processor 102 may further comprise a USB on-the-go (OTG) block 174, a AUX ADC block 172, a general-purpose I/O (GPIO) block 170, a LCD block 168, a camera block 166, a SDIO block 164, a SIM interface 162, and a pulse code modulation (PCM) block 160. The baseband processor 102 may communicate with the Bluetooth radio 196 via the PCM block 160, and in some instances, via the UART 112 and/or the I2S block 182, for example.

The baseband processor 102 may further comprise a plurality of transmit (Tx) digital-to-analog converter (DAC) for in-phase (I) and quadrature (Q) signal components 120, . . . , 126, plurality of RF control 122, . . . , 128, and a plurality of receive (Rx) analog-to-digital converter (ADC) for I and Q signal components 124, . . . , 130. In this regard, receive, control, and/or transmit operations may be based on the type of transmission technology, such as EDGE, HSDPA, and/or WCDMA, for example. The baseband processor 602 may also comprise an SRAM block 152, an external memory control block 154, a security engine block 156, a CRC generator block 158, a system interconnect 150, a modem accelerator 132, a modem control block 134, a stack processor block 136, a DSP subsystem 138, a DMAC block 140, a multimedia subsystem 142, a graphic accelerator 144, an MPEG accelerator 146, and a JPEG accelerator 148. Notwithstanding the wireless system 100 disclosed in FIG. 1, aspects of the invention need not be so limited.

Figure 2A:
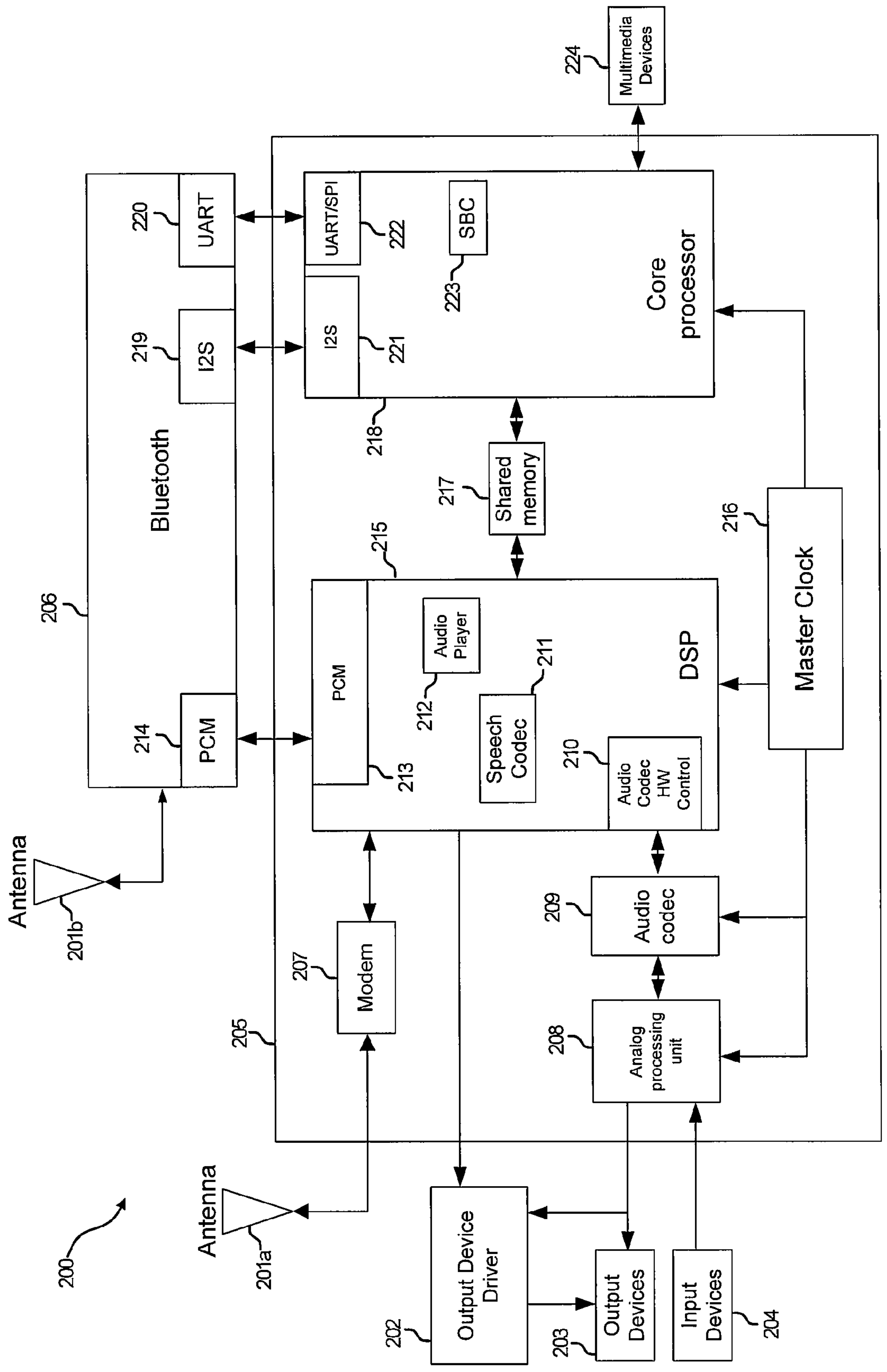
FIG. 2A is a block diagram illustrating an exemplary multimedia baseband processor communicatively coupled to a Bluetooth radio, in accordance with an embodiment of the invention.

FIG. 2A is a block diagram illustrating an exemplary multimedia baseband processor communicatively coupled to a Bluetooth radio, in accordance with an embodiment of the invention. Referring to FIG. 2A, there is shown a wireless system 200 that may comprise a baseband processor 205, antennas 201*a* and 201*b*, a Bluetooth radio 206, an output device driver 202, output devices 203, input devices 204, and multimedia devices 224. The wireless system 200 may comprise similar components as those disclosed for the wireless system 100 in FIG. 1. The baseband processor 205 may comprise a modem 207, a digital signal processor (DSP) 215, a shared memory 217, a core processor 218, an audio coder/decoder unit (codec) 209, an analog processing unit 208, and a master clock 216. The core processor 218 may be, for example, an ARM processor integrated within the baseband processor 205. The DSP 215 may comprise a speech codec 211, an audio player 212, a PCM block 213, and an audio codec hardware control 210. The core processor 218 may comprise an I2S block 221, a UART and serial peripheral interface (UART/SPI) block 222, and a sub-band coding (SBC) codec 223. The Bluetooth radio 206 may comprise a PCM block 214, an I2S block 219, and a UART 220.

The antennas 201*a* and 210*b* may comprise suitable logic circuitry, and/or code that may enable wireless signals transmission and/or reception. The output device driver 202 may comprise suitable logic, circuitry, and/or code that may enable controlling the operation of the output devices 203. In this regard, the output device driver 202 may receive at least one signal from the DSP 215 and/or may utilize at least one signal generated by the analog processing unit 208. The output devices 203 may comprise suitable logic, circuitry, and/or code that may enable playing, storing, and/or communicating analog audio, voice, polyringer, and/or mixed signals from the analog processing unit 208. The output devices 203 may comprise speakers, speaker phones, stereo speakers, headphones, and/or storage devices such as audio tapes, for example. The input devices 204 may comprise suitable logic, circuitry, and/or code that may enable receiving of analog audio and/or voice data and communicating it to the analog processing unit 208 for processing. The input devices 204 may comprise one or more microphones and/or auxiliary microphones, for example. The multimedia devices 224 may comprise suitable logic, circuitry, and/or code that may be enable communication of multimedia data with the core processor 218 in the baseband processor 205. The multimedia devices 224 may comprise cameras, video recorders, video displays, and/or storage devices such as memory sticks, for example.

The Bluetooth radio 206 may comprise suitable logic, circuitry, and/or code that may enable transmission, reception, and/or processing of information by utilizing the Bluetooth radio protocol. In this regard, the Bluetooth radio 206 may support amplification, filtering, modulation, and/or demodulation operations, for example. The Bluetooth radio 206 may enable data to be transferred from and/or to the baseband processor 205 via the PCM block 214, the I2S block 219, and/or the UART 220, for example. In this regard, the Bluetooth radio 206 may communicate with the DSP 215 via the PCM block 214 and with the core processor 218 via the I2S block 221 and the UART/SPI block 222.

The modem 207 in the baseband processor 205 may comprise suitable logic, circuitry, and/or code that may enable modulation and/or demodulation of signals communicated via the antenna 201*a*. The modem 207 may communicate with the DSP 205. The shared memory 217 may comprise suitable logic, circuitry, and/or code that may enable storage of data. The shared memory 217 may be utilized for communicating data between the DSP 215 and the core processor 218. The master clock 216 may comprise suitable logic, circuitry, and/or code that may enable generating at least one clock signal for various components of the baseband processor 205. For example, the master clock 216 may generate at least one clock signal that may be utilized by the analog processing unit 208, the audio codec 209, the DSP 215, and/or the core processor 218, for example.

The core processor 218 may comprise suitable logic, circuitry, and/or code that may enable processing of audio and/or voice data communicated with the DSP 215 via the shared memory 217. The core processor 218 may comprise suitable logic, circuitry, and/or code that may enable processing of multimedia information communicated with the multimedia devices 224. In this regard, the core processor 218 may also control at least a portion of the operations of the multimedia devices 224, such as generation of signals for controlling data transfer, for example. The core processor 218 may also enable communicating with the Bluetooth radio via the I2S block 221 and/or the UART/SPI block 222. The core processor 218 may also be utilized to control at least a portion of the operations of the baseband processor 205, for example. The SBC codec 223 in the core processor may comprise suitable logic, circuitry, and/or code that may enable coding and/or decoding audio signals, such as music or mixed audio data, for example, for communication with the Bluetooth radio 206.

The DSP 215 may comprise suitable logic, circuitry, and/or code that may enable processing of a plurality of audio signals, such as digital general audio data, digital voice data, and/or digital polyringer data, for example. In this regard, the DSP 215 may enable generation of digital polyringer data. The DSP 215 may also enable generation of at least one signal that may be utilized for controlling the operations of, for example, the output device driver 202 and/or the audio codec 209. The DSP 215 may be utilized to communicate processed audio and/or voice data to the core processor 218 and/or to the Bluetooth radio 206. The DSP 215 may also enable receiving audio and/or voice data from the Bluetooth radio 206 and/or from the multimedia devices 224 via the core processor 218 and the shared memory 217.

The speech codec 211 may comprise suitable logic, circuitry, and/or code that may enable coding and/or decoding of voice data. The audio player 212 may comprise suitable logic, circuitry, and/or code that may enable coding and/or decoding of audio or musical data. For example, the audio player 212 may be utilized to process digital audio encoding formats such as MP3, WAV, AAC, uLAW/AU, AIFF, AMR, and MIDI, for example. The audio codec hardware control 210 may comprise suitable logic, circuitry, and/or code that may enable communication with the audio codec 209. In this regard, the DSP 215 may communicate more than one audio signal to the audio codec 209 for processing. Moreover, the DSP 215 may also communicate more than one signal for controlling the operations of the audio codec 209.

The audio codec 209 may comprise suitable logic, circuitry, and/or code that may enable processing audio signals received from the DSP 215 and/or from input devices 204 via the analog processing unit 208. The audio codec 209 may enable utilizing a plurality of digital audio inputs, such as 16 or 18-bit inputs, for example. The audio codec 209 may also enable utilizing a plurality of data sampling rate inputs. For example, the audio codec 209 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio codec 209 may also support mixing of a plurality of audio sources. For example, the audio codec 209 may support at least three audio sources, such as general audio, polyphonic ringer, and voice. In this regard, the general audio and polyphonic ringer sources may support the plurality of sampling rates that the audio codec 209 is enabled to accept, while the voice source may support a portion of the plurality of sampling rates, such as 8 kHz and 16 kHz, for example.

The audio codec 209 may also support independent and dynamic digital volume or gain control for each of the audio sources that may be supported. The audio codec 209 may also support a mute operation that may be applied to each of the audio sources independently. The audio codec 209 may also support adjustable and programmable soft ramp-ups and ramp-down for volume control to reduce the effects of clicks and/or other noises, for example. The audio codec 209 may also enable downloading and/or programming a multi-band equalizer to be utilized in at least a portion of the audio sources. For example, a 5-band equalizer may be utilized for audio signals received from general audio and/or polyphonic ringer sources.

The audio codec 209 may also utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, filter coefficients may all be switched in one-shot or may be switched sequentially, for example. The audio codec 209 may also utilize a modulator, such as a Delta-Sigma ($\Delta$-$\Sigma$) modulator, for example, to code digital output signals for analog processing.

In operation, the audio codec 209 in the wireless system 200 may communicate with the DSP 215 in order to transfer audio data and control signals. Control registers for the audio codec 209 may reside within the DSP 215. For voice data, the audio samples need not be buffered between the DSP 215 and the audio codec 209. For general audio data and for polyphonic ringer path, audio samples from the DSP 215 may be written into a FIFO and then the audio codec 209 may fetch the data samples. The DSP 215 and the core processor 218 may exchange audio signals and control information via the shared memory 217. The core processor 218 may write PCM audio directly into the shared memory 217. The core processor 218 may also communicate coded audio data to the DSP 215 for computationally intensive processing. In this regard, the DSP 215 may decode the data and may write the PCM audio signals back into the shared memory 217 for the core processor 218 to access. Moreover, the DSP 215 may decode the data and may communicate the decoded data to the audio codec 209. The core processor 218 may communicate with the audio codec 209 via the DSP 215. Notwithstanding the wireless system 200 disclosed in FIG. 2A, aspects of the invention need not be so limited.

Figure 2B:
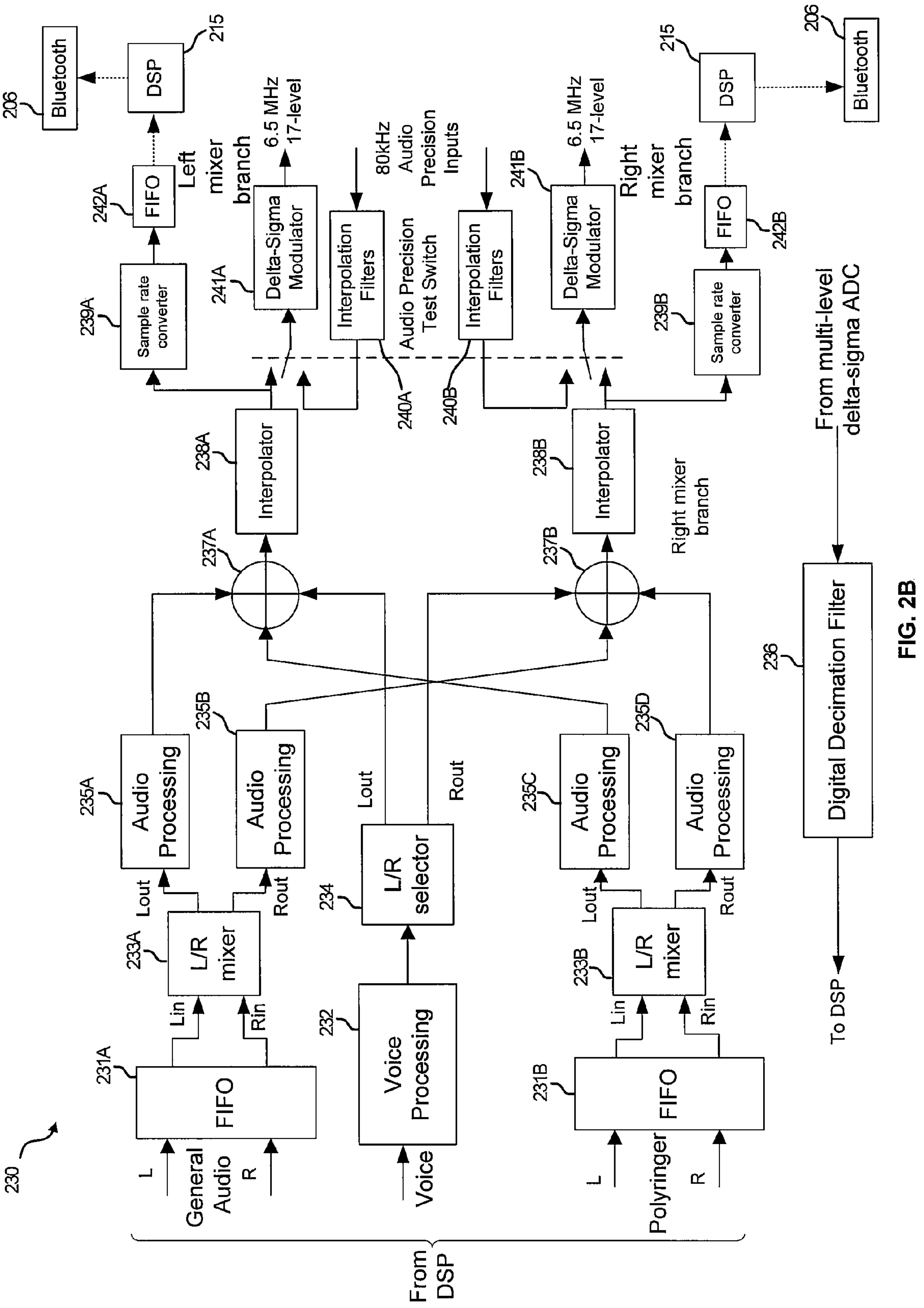
FIG. 2B is a block diagram illustrating an exemplary audio codec in a multimedia baseband processor, in accordance with an embodiment of the invention.

FIG. 2B is a block diagram illustrating an exemplary audio codec in a multimedia baseband processor, in accordance with an embodiment of the invention. Referring to FIG. 2B, there is shown an audio codec 230 that may correspond to the audio codec 209 disclosed in FIG. 2A. The audio codec 230 may comprise a first portion for communicating data from a DSP, such as the DSP 215, to output devices and/or to a Bluetooth radio, such the output devices 203 and the Bluetooth radio 206. The audio codec 230 may also comprise a second portion that may be utilized for communicating data from input devices, such as the input devices 204, to the DSP 215, for example.

The first portion of the audio codec 230 may comprise a general audio path from the DSP 215, a voice path from the DSP 215, and a polyphonic ringer or polyringer path from the DSP 215. In this regard, the audio codec 230 may utilize a separate processing path before mixing each audio source or audio source type that may be supported. The general audio path may comprise a FIFO 231A, a left and right channels (L/R) mixer 233A, a left channel audio processing block 235A, and a right channel audio processing block 235B. The voice path may comprise a voice processing block 232 and a left and right channels (L/R) selector 234. The polyringer path may comprise a FIFO 231B, an L/R mixer 233B, a left channel audio processing block 235C, and a right channel audio processing block 235D.

Regarding the general audio path and the polyringer path, the FIFOs 231A and 231B may comprise suitable logic, circuitry, and/or code that may enable storage of left and right channel audio signals from general audio source and polyringer source respectively. In this regard, each of the audio signals may be sampled at one of a plurality of sample rates that may be supported by the audio codec 230 for general audio data and/or polyringer data. The L/R mixer 233A may comprise suitable logic, circuitry, and/or code that may enable mixing the input right and left channels from the FIFO 231A to generate mixed left and right channel outputs to the audio processing blocks 235A and 235B respectively. The L/R mixer 233B may comprise suitable logic, circuitry, and/or code that may enable mixing the input right and left channels from the FIFO 231B to generate mixed left and right channel outputs to the audio processing blocks 235C and 235D respectively. The audio processing blocks 235A, 235B, 235C, and 235D may comprise suitable logic, circuitry, and/or code that may enable processing audio signals. In this regard, the audio processing blocks 235A, 235B, 2350, and/or 235D may support equalization operations, compensation operations, rate adaptation operations, and/or volume control operations, for example. The outputs of the audio processing blocks 235A and 235C may be communicated to the left channel branch mixer 237A. The outputs of the audio processing blocks 235B and 235D may be communicated to the right channel branch mixer 237B. The rate adaptation operations enable the outputs of the audio processing blocks 235A, 235B, 235C, and 235D to be at the same sampling rate when communicated to the mixers 237A and 237B.

Regarding the voice path, the voice processing block 232 may comprise suitable logic, circuitry, and/or code that may enable processing voice received from the DSP 215 in one of a plurality of voice sampling rates supported by the audio codec 230. In this regard, the voice processing block 232 may support compensation operations, rate adaptation operations, and/or volume control operations, for example. The L/R selector 234 may comprise suitable logic, circuitry, and/or code that may enable separating the voice signal contents into a right channel signal that may be communicated to the mixer 237B and a left channel signal that may be communicated to the mixer 237A. The rate adaptation operation may enable the outputs of the voice processing blocks 232 to be at the same sampling rate as the outputs of the audio processing blocks 235A, 235B, 235C, and/or 235D when communicated to the mixers 237A and 237B. For example, the input signals to the mixers 237A and 237B may be adjusted via up and/or down sampling in the audio processing blocks 235A, 235B, 235C, and 235D and the voice processing block 232 to have the same sampling rates.

The mixer 237A may comprise suitable logic, circuitry, and/or code that may enable mixing the outputs of the audio processing blocks 235A and 235C and the left channel output of the L/R selector 234. The mixer 237B may comprise suitable logic, circuitry, and/or code that may enable mixing the outputs of the audio processing blocks 235B and 235D and the right channel output of the L/R selector 234. The output of the mixer 237A may be associated with the left channel branch of the audio codec 230 while the output of the mixer 237B may be associated with the right channel branch of the audio codec 230. Also associated with the left channel branch may be an interpolator 238A, a sample rate converter 239A, a FIFO 242A, a Δ-Σ modulator 241A, and an interpolation filter 240A. Also associated with the right channel branch may be an interpolator 238B, a sample rate converter 239B, a FIFO 242B, a Δ-Σ modulator 241B, and an interpolation filter 240B. The interpolation filters 240A and 240B may be optional and may be utilized for testing, for example, to interface to audio testing equipment using, for example, the Audio Precision interface, and/or any other interfaces that may be adopted in the industry.

The interpolators 238A and 238B may comprise suitable logic, circuitry, and/or code that may enable up-sampling of the outputs of the mixers 237A and 237B. The sample rate converters 239A and 239B may comprise suitable logic, circuitry, and/or code that may enable adjusting the output signals from the interpolators 238A and 239B to a sampling rate that may be utilized by the DSP 215 and/or the core processor 218 for communication to the Bluetooth radio 206. In this regard, the sample rate converters 239A and 239B may adjust the sampling rates to 44.1 kHz or 48 kHz, for example, for subsequent communication to the Bluetooth radio 206. The sample rate converters 239A and 239B may be implemented as interpolators, such as linear interpolators, for example, or by utilizing more sophisticated or complex decimation filters, for example. The audio and/or voice signal outputs from the sample rate converters 239A and 239B may be communicated to FIFOs 242A and 242B before being communicated to the DSP 215 and/or to the core processor 218 and later to the Bluetooth radio 206. The Δ-Σ modulators 241A and 241B may comprise suitable logic, circuitry, and/or code that may enable further bitwidth reduction of the outputs of the interpolators 238A and 238B to achieve a specified level output signal. For example, the Δ-Σ modulators 241A and 241B may receive 23-bit 6.5 MHz signals from the interpolators 238A and 238B and may further reduce the signal levels to generate 6.5 MHz 17-level signals, for example.

The second portion of the audio codec 230 may comprise a digital decimation filter 236. The digital decimation filter 236 may comprise suitable logic, circuitry, and/or code that may enable processing a digital audio signal received from the analog processing unit 208, for example, before communicating the processed audio signal to the DSP 215. The digital decimation filter 236 may comprise FIR decimation filters and/or CIC decimation filters, for example, that may be followed by a plurality of IIR compensation and decimation filters, for example.

Figure 2C:
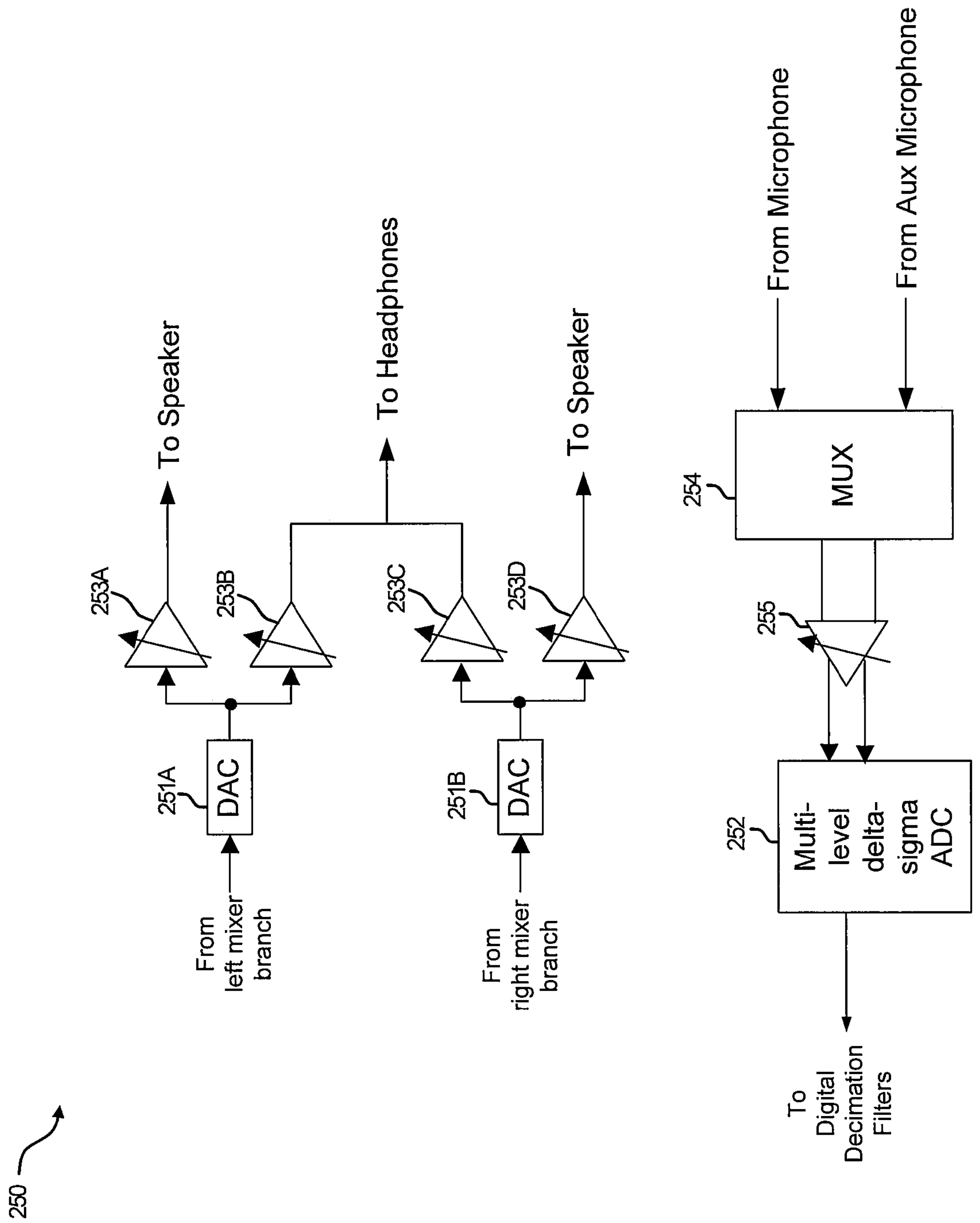
FIG. 2C is a block diagram illustrating an exemplary analog processing unit in a multimedia baseband processor, in accordance with an embodiment of the invention.

FIG. 2C is a block diagram illustrating an exemplary analog processing unit in a multimedia baseband processor, in accordance with an embodiment of the invention. Referring to FIG. 2C, there is shown an analog processing unit 250 that may correspond to the analog processing unit 208 in FIG. 2A. The analog processing unit 250 may comprise a first portion for digital-to-analog conversion and a second portion for analog-to-digital conversion. The first portion may comprise a first digital-to-analog converter (DAC) 251A and a second DAC 251B that may each comprise suitable logic, circuitry, and/or code that may enable converting digital signals from the left and the right mixer branches in the audio codec 230, respectively, to analog signals. The output of the DAC 251A may be communicated to the variable gain amplifiers 253A and 253B. The output of the DAC 251B may be communicated to the variable gain amplifiers 253C and 253D. The variable gain amplifiers 253A, 253B, 253C, and 253D may each comprise suitable logic, circuitry, and/or code that may enable dynamic variation of the gain applied to their corresponding input signals. The output of the amplifier 253A may be communicated to at least one left speaker while the output of the amplifier 253D may be communicated to at least one right speaker, for example. The outputs of amplifiers 253B and 253D may be combined and communicated to a set of headphones, for example.

The second portion of the analog processing unit 250 may comprise a multiplexer (MUX) 254, a variable gain amplifier 255, and a multi-level Delta-Sigma (Δ-Σ) analog-to-digital converter (ADC) 252. The MUX 254 may comprise suitable logic, circuitry, and/or code that may enable selection of an input analog signal from a microphone or from an auxiliary microphone, for example. The variable gain amplifier 255 may comprise suitable logic, circuitry, and/or code that may enable dynamic variation of the gain applied to the analog output of the MUX 254. The multi-level Δ-Σ ADC 252 may comprise suitable logic, circuitry, and/or code that may enable conversion of the amplified output of the variable gain amplifier 255 to a digital signal that may be communicated to the digital decimation filter 236 in the audio codec 230 disclosed in FIG. 2B. In some instances, the multi-level Δ-Σ ADC 252 may be implemented as a 3-level Δ-Σ ADC, for example. Notwithstanding the exemplary analog processing unit 250 disclosed in FIG. 2C, aspects of the invention need not be so limited.

Figure 2D:
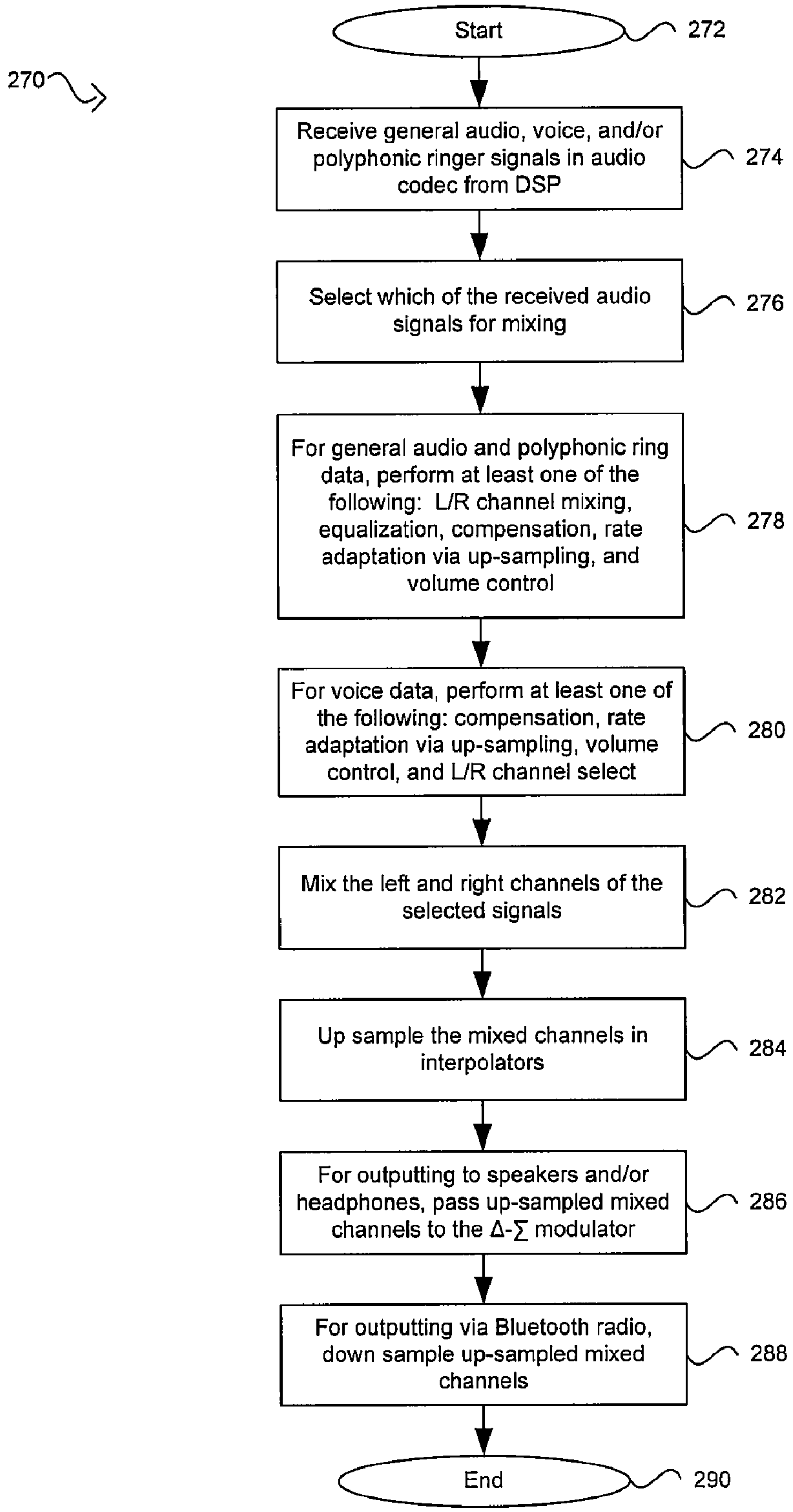
FIG. 2D is a flow diagram illustrating exemplary steps for data mixing in the audio codec, in accordance with an embodiment of the invention.

FIG. 2D is a flow diagram illustrating exemplary steps for data mixing in the audio codec, in accordance with an embodiment of the invention. Referring to FIG. 2D, there is shown a flow 270. After start step 272, in step 274, the audio codec 230 disclosed in FIG. 2B may receive two or more audio signals from a general audio source, a polyphonic ringer audio source, and/or a voice audio source via the DSP 215, for example. In step 276, the audio codec 230 may be utilized to select two or more of the received audios signals for mixing. In this regard, portions of the audio codec 230 may be programmed, adjusted, and/or controlled to enable selected audio signals to be mixed. For example, a mute operation may be utilized to determine which audio signals may be mixed in the audio codec 230.

In step 278, when the audio signals to be mixed comprises general audio and/or polyphonic ringer audio, the signals may be processed in the audio processing blocks 235A, 235B, 235C, and 235D where equalization operations, compensation operations, rate adaptation operations, and/or volume control operations may be performed on the signals. Regarding the rate adaptation operations, the data sampling rate of the input general audio or polyphonic ringer audio signals may be adapted to a specified sampling rate for mixing. In step 280, when one of the audio signals to be mixed comprises voice, the voice signal may be processed in the voice processing block 232 where compensation operations, rate adaptation operations, and/or volume control operations may be performed on the voice signals. Regarding the rate adaptation operations, the data sampling rate of the input voice signals may be adapted to specified sampling rate for mixing.

In step 282, the left channel general audio and polyringer signals generated by the audio processing blocks 235A and 235C and the left channel voice signals generated by the L/R selector 234 may be mixed in the mixer 237A. Similarly, the right channel general audio and polyringer signals generated by the audio processing blocks 235B and 235D and the right channel voice signals generated by the L/R selector 234 may be mixed in the mixer 237B. In step 284, the outputs of the mixers 237A and 237B corresponding to the mixed left and right channel signals may be up-sampled by the interpolators 238A and 238B respectively. By generating signals with a higher sampling rate after mixing, the implementation of the sample rate converters 239A and 239B may also be simplified.

In step 286, when communicating the up-sampled mixed left and right channels signals to output devices, such as the output devices 203 disclosed in FIG. 2A, the audio codec 230 may utilize the Δ-Σ modulators 214A and 241B to reduce the digital audio signals to signals with the fewer but appropriate number of levels. In this regard, the output signals may be communicated to the DACs 251A and 251B and to the variable gain amplifiers 253A, 253B, 253C, and 253D disclosed in FIG. 2C for analog conversion and for signal gain respectively. In step 288, when communicating the up-sampled mixed left and right channel signals to the Bluetooth radio 206, the audio codec 230 may down-sample the audio signals by utilizing the sample rate converters 239A and 239B and then communicating the down-sampled signals to the FIFOs 242A and 242B. The DSP 215 may fetch the down-sampled audio signals from the FIFOs 242A and 242B and may then communicate the digital audio signals to the Bluetooth radio 206. Notwithstanding the exemplary steps for mixing audio sources disclosed in FIG. 2D, aspects of the invention need not be so limited.

Figure 3A:
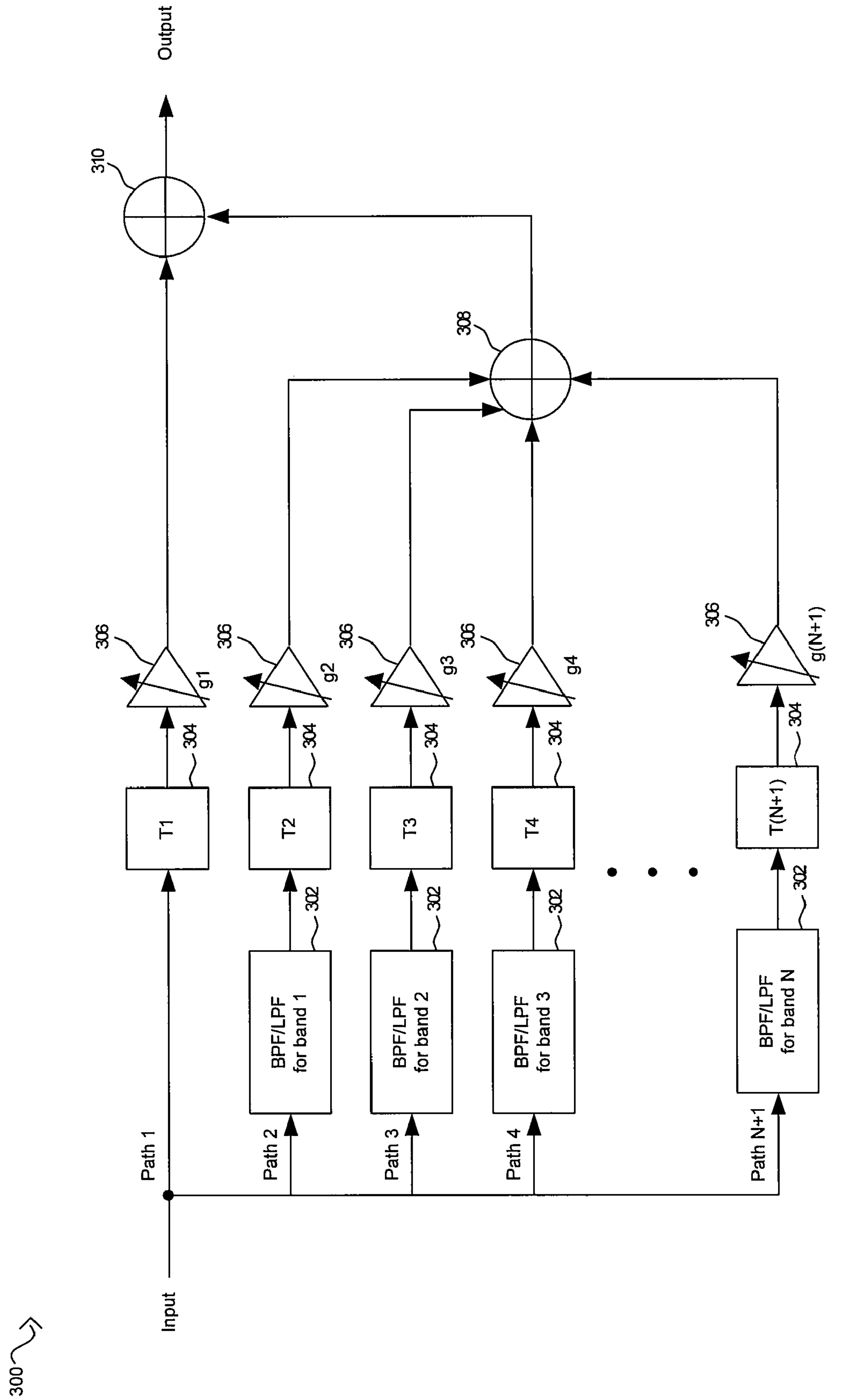
FIG. 3A is a block diagram of an exemplary multi-band equalizer, in accordance with an embodiment of the invention.

FIG. 3A is a block diagram of an exemplary multi-band equalizer, in accordance with an embodiment of the invention. Referring to FIG. 3A, there is shown a multi-band equalizer 300 that may be utilized for equalization operations in, for example, the audio processing blocks 235A, 235B, 235C, and/or 235D disclosed in FIG. 2B. The multi-band equalizer 300 may comprise a plurality of bandpass filters/low pass filters (BPF/LPFs) 302, a plurality of delays 304, a plurality of variable gain amplifiers 306, a first adder 308, and a second adder 310. The multi-band equalizer 300 may comprise a plurality of paths, wherein a first path may be referred to as a direct path where a filter may not be utilized. Each of the BPF/LPF 302 may comprise suitable logic, circuitry, and/or code that may enable filtering the input signal for a specified frequency band. In this regard, each of the BPF/LPF 302 may be configured to have different center frequencies with different bandwidths. Each of the plurality of delays 304 may comprise suitable logic, circuitry, and/or code that may enable adjustments to match the group delay differences among different bands. For example, for band 2, a delay T2 may be utilized while for band N a delay T(N+1) may be utilized. The plurality of variable gain amplifiers 306 may comprise suitable logic, circuitry, and/or code that may enable adjusting the gain for the corresponding band. In this regard, the gain to a band may be increased when the gain is positive, for example, or decreased when the gain is negative, for example, in accordance with the operations of the multi-band equalizer 300. The BPF/LPFs 302, the delays 304, and/or the variable gain amplifiers 306, may be programmable and dynamically adjusted, for example. The adders 308 and 310 may comprise suitable logic, circuitry, and/or code that may enable adding the outputs of the variable gain amplifiers 306 in order to generate an equalized output signal.

In operation, the input signal may be communicated to the each path in the multi-band equalizer 300 for processing. The first path does not utilize a filter and the input signal may be directly delayed by T1 and then amplified by a gain g1 provided by the variable gain amplifier 306 associated with the first path. In the second and following paths, the input signal is filtered by the corresponding BPF/LPF 302 associated with each path, then delayed by the corresponding delay value T2, . . . , T(N+1) associated with each path, and amplified by the corresponding gain g2, . . . , g(N+1) associated with each path. The outputs of the variable gain amplifiers 306 associated with paths 2, . . . , N+1 may be added by the adder 306. The output of the adder 306 and the output of the variable gain amplifier 302 associated with the first path may be added by the adder 310 to generate the equalized output signal.

Each of the BPF/LPFs 302 may be implemented by utilizing FIR filters, IIR filters, or a combination of FIR and IIR filters. In some instances, when FIR filter implementations are utilized and the same filter length is utilized for each band, delay adjustments may be utilized only on the path that does not utilize a filter. Moreover, the data storage for a filter may be shared among at least a portion of the remaining filters. With IIR filter implementations, the group delay may be dependent on the frequency and need not be uniform across the passband. In this regard, the delay amount may be correct for the average group delay. Notwithstanding the exemplary multi-band equalizer disclosed in FIG. 3A, aspects of the invention need not be so limited.

Figure 3B:
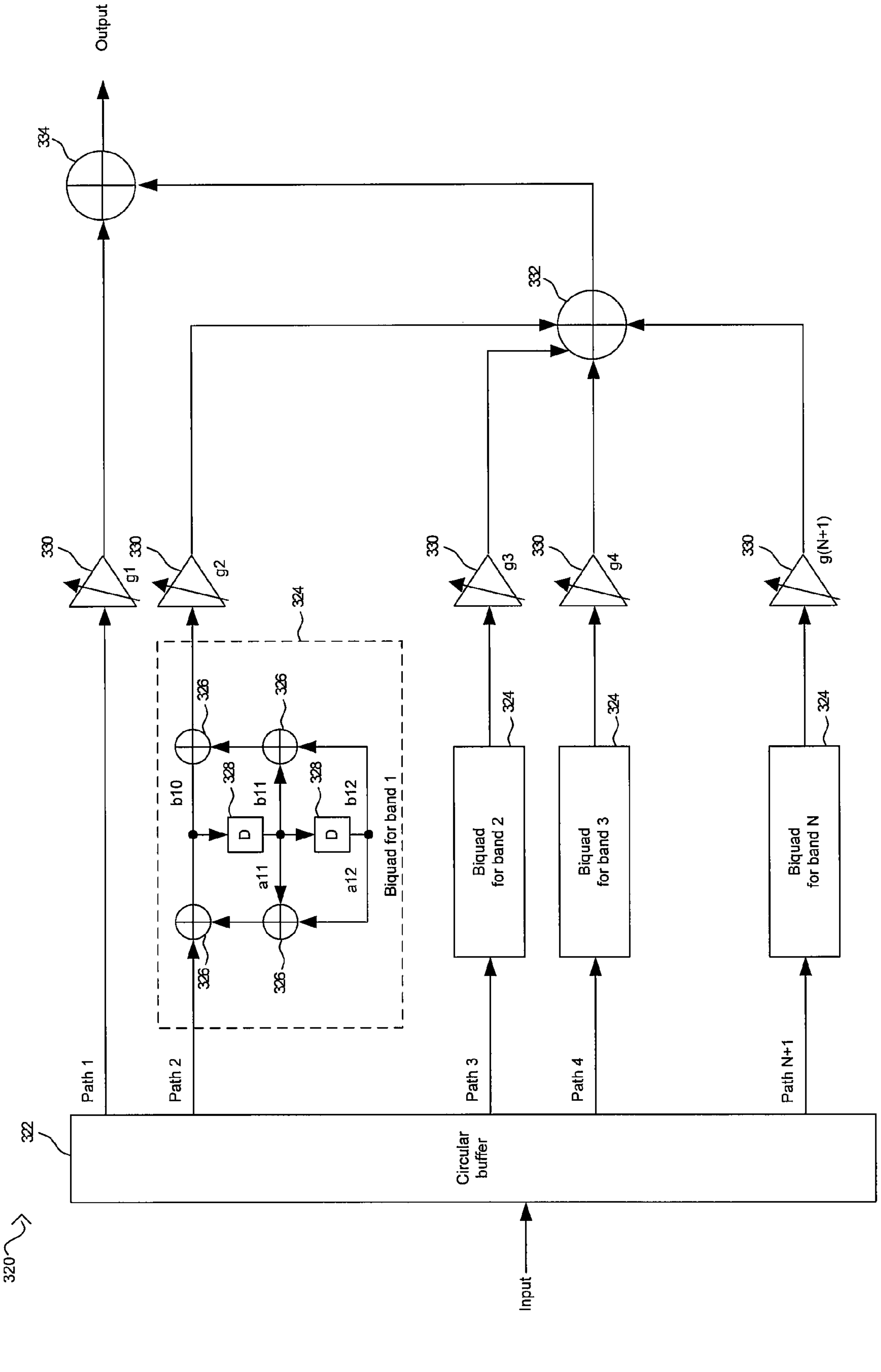
FIG. 3B is a block diagram of an exemplary multi-band equalizer that utilizes biquads bandpass filtering, in accordance with an embodiment of the invention.

FIG. 3B is a block diagram of an exemplary multi-band equalizer that utilizes biquads (IIR) bandpass filtering, in accordance with an embodiment of the invention. Referring to FIG. 3B, there is shown a multi-band equalizer 320 where each of the BPF/LPF 302 may be implemented utilizing biquad filters 324 and the delays may be implemented utilizing a circular buffer 322. In this regard, the variable gain amplifiers 330 and the adders 332 and 334 may correspond to the variable gain amplifiers 306 and the adders 308 and 310 disclosed in FIG. 3A. Each of the biquad filters 324 may comprise four adders 326 and two delays 328 that may be utilized to provide the appropriate filtering operation. In this regard, the filter coefficients a11, b11, a12, b12, and b10 may be configured to provide the appropriate filtering operation. Each of the biquad filters 324 may be programmable and dynamically adjusted. The circular buffer 322 may comprise suitable logic, circuitry, and/or code that may enable sharing storage of data to provide the appropriate delays for each of the paths in the multi-band equalizer 320.

Figure 4A:
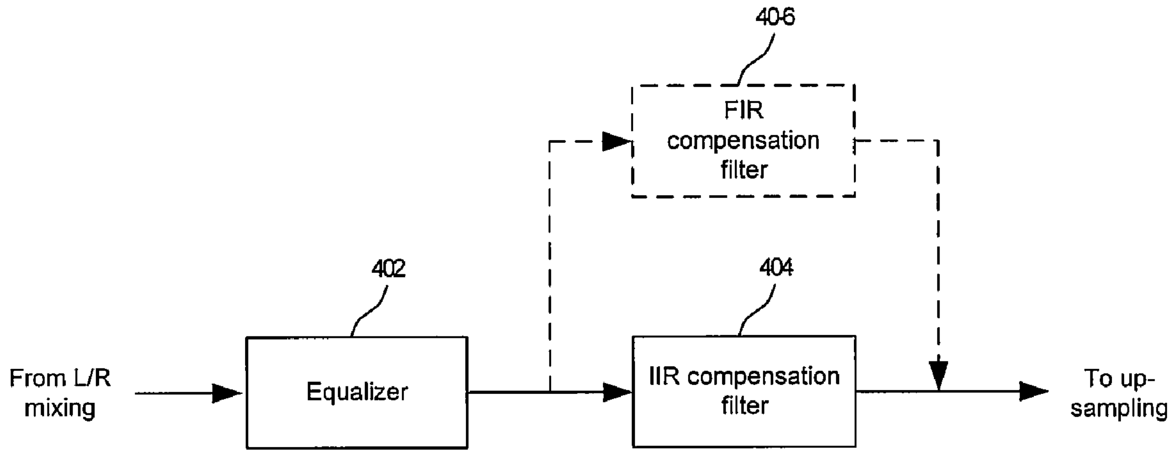
FIG. 4A is a block diagram illustrating exemplary compensation operations in an audio codec, in accordance with an embodiment of the invention.

FIG. 4A is a block diagram illustrating exemplary compensation operations in an audio codec, in accordance with an embodiment of the invention. Referring to FIG. 4A, there is shown a portion of the audio processing blocks 235A, 235B, 235C, and/or 235D disclosed in FIG. 2B that may comprise an equalizer 402 and an IIR compensation filter 404. The equalizer 402 may correspond to the multi-band equalizers 300 and 320 disclosed in FIGS. 3A-3B respectively. The IIR compensation filter 404 may comprise suitable logic, circuitry, and/or code that may enable further conditioning of audio signals from general audio and/or polyphonic ringer sources by providing frequency response compensation for, for example, distortion that may be introduced by audio output devices, such as the speakers or ear buds. The IIR compensation filter 404 may be implemented by utilizing biquad filters, for example. The FIR compensation filter 406 shown in FIG. 4A may be utilized as an alternative filter to the IIR compensation filter 404. In this regard, the FIR compensation filter 406 may comprise suitable logic, circuitry, and/or code that may enable frequency response compensation for distortion that may be introduced by audio output devices. The FIR compensation filter 406 may comprise non-linear phase and the filter coefficients need not have symmetry around the center tap. Selection of the IIR compensation filter 404 or the FIR compensation filter 406 may be programmable and dynamically adjusted, for example.

For the IIR compensation filter 404 and the FIR compensation filter 406, when sampling rates change, the filter coefficients and filter length may have to be adjusted or reconfigured. Moreover, when audio output devices change, such as a switch between earphones and loud speakers, for example, the filter coefficients and filter length may also have to be adjusted or reconfigured. In this regard, filter storages may be set to zero upon power on or upon reconfiguration, for example. Notwithstanding the exemplary compensation operations disclosed in FIG. 4A, aspects of the invention need not be so limited.

Figure 4B:
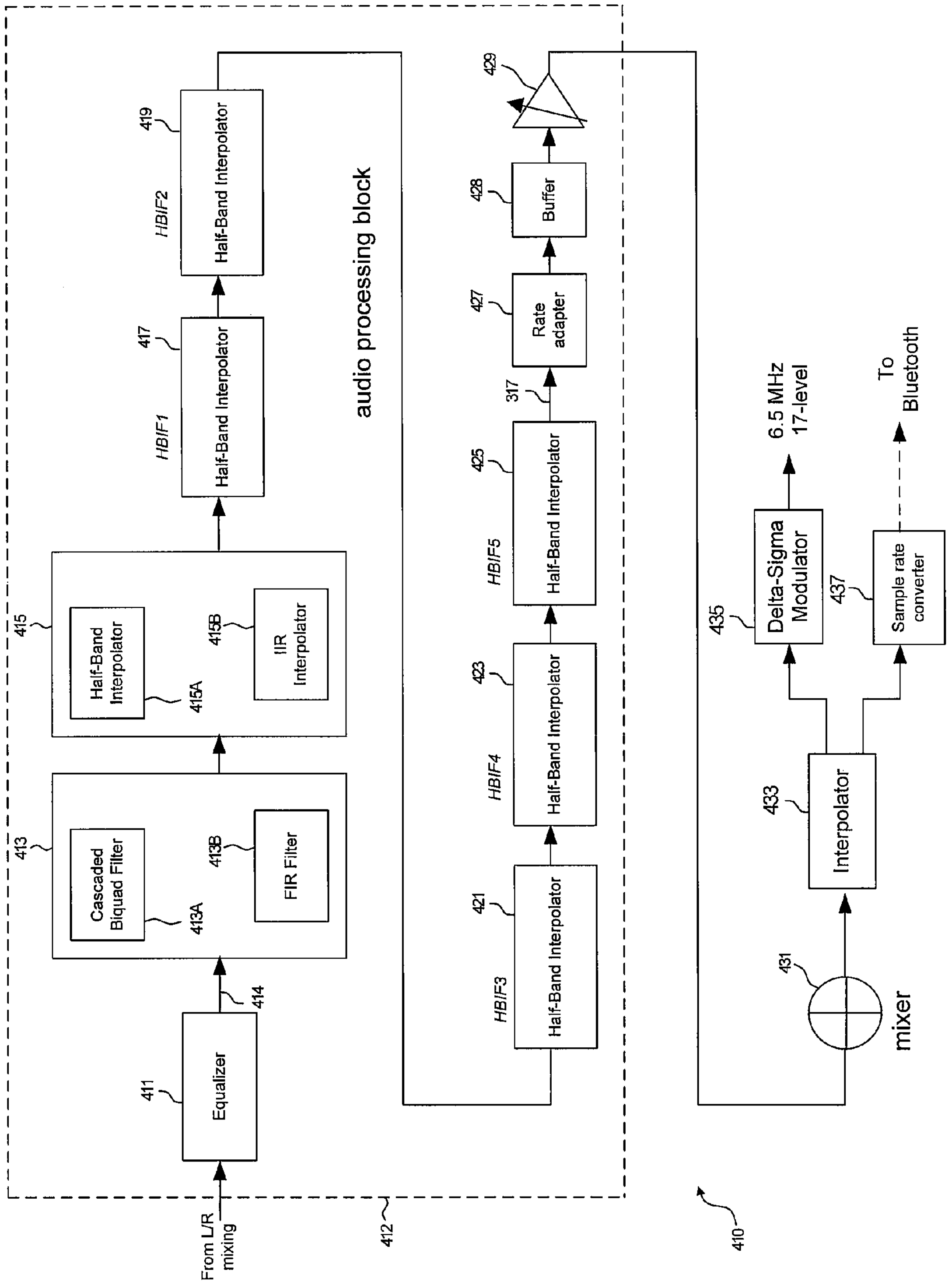
FIG. 4B is a block diagram of an exemplary audio processing data path, in accordance with an embodiment of the invention.

FIG. 4B is a block diagram of an exemplary audio processing data path, in accordance with an embodiment of the invention. Referring to FIG. 4B, there is shown an audio data path 410 that may comprise an audio processing block 412, a mixer 431, an interpolator 433, a Δ-Σ modulator 435, and a sample rate converter 437. The audio processing block 412 may be the same or substantially similar to the audio processing blocks 235A, 235B, 235C, and 235D disclosed in FIG. 2B. Similarly, the mixer 431, the interpolator 433, the Δ-Σ modulator 435, and a sample rate converter 437 may be the same or substantially similar to the corresponding devices or components disclosed in FIG. 2B.

The audio processing block 412 may comprise an equalizer 411, a compensation filter 413, an interpolator block 415, half-band interpolator filters 417, 419, 421, 423, and 425, a rate adapter 427, a buffer 428, and a variable gain amplifier 429. The equalizer 411 may be the same or substantially similar to the equalizer 402 disclosed in FIG. 4A. The compensation filter 413 may comprise a cascaded biquad filter 413A and a FIR filter 413B. The interpolator block 415 may comprise a half-band interpolator filter (HBIF) 415A and an infinite impulse response (IIR) interpolator 415B. The digital audio input signal 414 from the equalizer 411 may be communicated to the compensation filter 413. The output of the compensation filter 413 may be communicated to the interpolator block 415 which may then be communicated to the HBIF 417. The output of the HBIF1 417 may be communicated to the HBIF2 419, then similarly with the HBIF3 421, the HBIF4, 423, and the HBIF5 425. The output of HBIF5 may be communicated to subsequent circuits such as the rate adapter 427, the buffer 428, and the variable gain amplifier 429, for example. The output of the variable gain amplifier 429 may be communicated to subsequent circuits such as the mixer 431, the interpolator 433, the sample rate converter 437, and the Δ-Σ modulator 435. The output of the Δ-Σ modulator 435 may be communicated to output devices while the output of the sample rate converter 437 may be communicated to a Bluetooth device.

The compensation filter 413 may comprise suitable logic, circuitry, and/or code for compensation of distortion that may have been introduced by output devices such as speakers and/or ear buds, for example. In one embodiment of the invention, a cascaded biquad filter 413A or a FIR filter 413B may be utilized for distortion compensation. In this regard, the cascaded biquad filter 413A or the FIR filter 413B may be selected for compensation of distortion in the digital audio input signal 414. In instances where the cascaded biquad filter 413A may be activated, signals may be routed to its inputs, and conversely, in instances when the FIR filter 413B may be activated, input signals may be routed to its inputs. The cascaded biquad filter 413A may be utilized with voice signals, for example. The FIR filter 413B may be utilized for the compensation of distortion in high quality audio in the digital audio input signal 414.

The interpolator blocks 415 417, 419, 421, 423, and 425 may comprise suitable logic, circuitry and/or code for up-converting the sample rate of the incoming digital audio signal by two in each stage. Table 1 below illustrates exemplary sampling rates in kHz at each stage of a five-stage interpolator from the input audio signal into the interpolator block 415 and then through each interpolator up to HBIF5 425, in accordance with an embodiment of the invention.

As shown in the example illustrated by Table 1, the sampling rates supported for the digital audio input signal may be doubled at each stage up to certain sampling rates, thus reducing the number of sampling rates from nine to three. In instances where the sampling rate reaches a final value at a stage earlier that HBIF5, such as 512, 705.6, or 768 kHz at HBIF3 or at HBIF 4 in the example illustrated in Table 1, the HBIF stages subsequent to that stage may not be activated. The number of sampling rates may be further reduced utilizing the rate adapter 427, for example. Notwithstanding the exemplary compensation filter 413 and data rate interpolator blocks 415, 417, 419, 421, 423 and 425, the rate adapter 427, the buffer 428, and the variable gain amplifier 429 disclosed in FIG. 4B, aspects of the invention need not be so limited.

TABLE 1

| Input (kHz) | IIR/HBIF0 | HBIF1 | HBIF2 | HBIF3 | HBIF4 | HBIF5 |
|---|---|---|---|---|---|---|
| 8 | 16 | 32 | 64 | 128 | 256 | 512 |
| 12 | 24 | 48 | 96 | 192 | 384 | 768 |
| 16 | 32 | 64 | 128 | 256 | 512 | 512 |
| 24 | 48 | 96 | 192 | 384 | 768 | 768 |
| 32 | 64 | 128 | 256 | 512 | 512 | 512 |
| 48 | 96 | 192 | 384 | 768 | 768 | 768 |
| 11.025 | 22.05 | 44.1 | 88.2 | 176.4 | 352.8 | 705.6 |
| 22.05 | 44.1 | 88.2 | 176.4 | 352.8 | 705.6 | 705.6 |
| 44.1 | 88.2 | 176.4 | 352.8 | 705.6 | 705.6 | 705.6 |

Figure 5A:
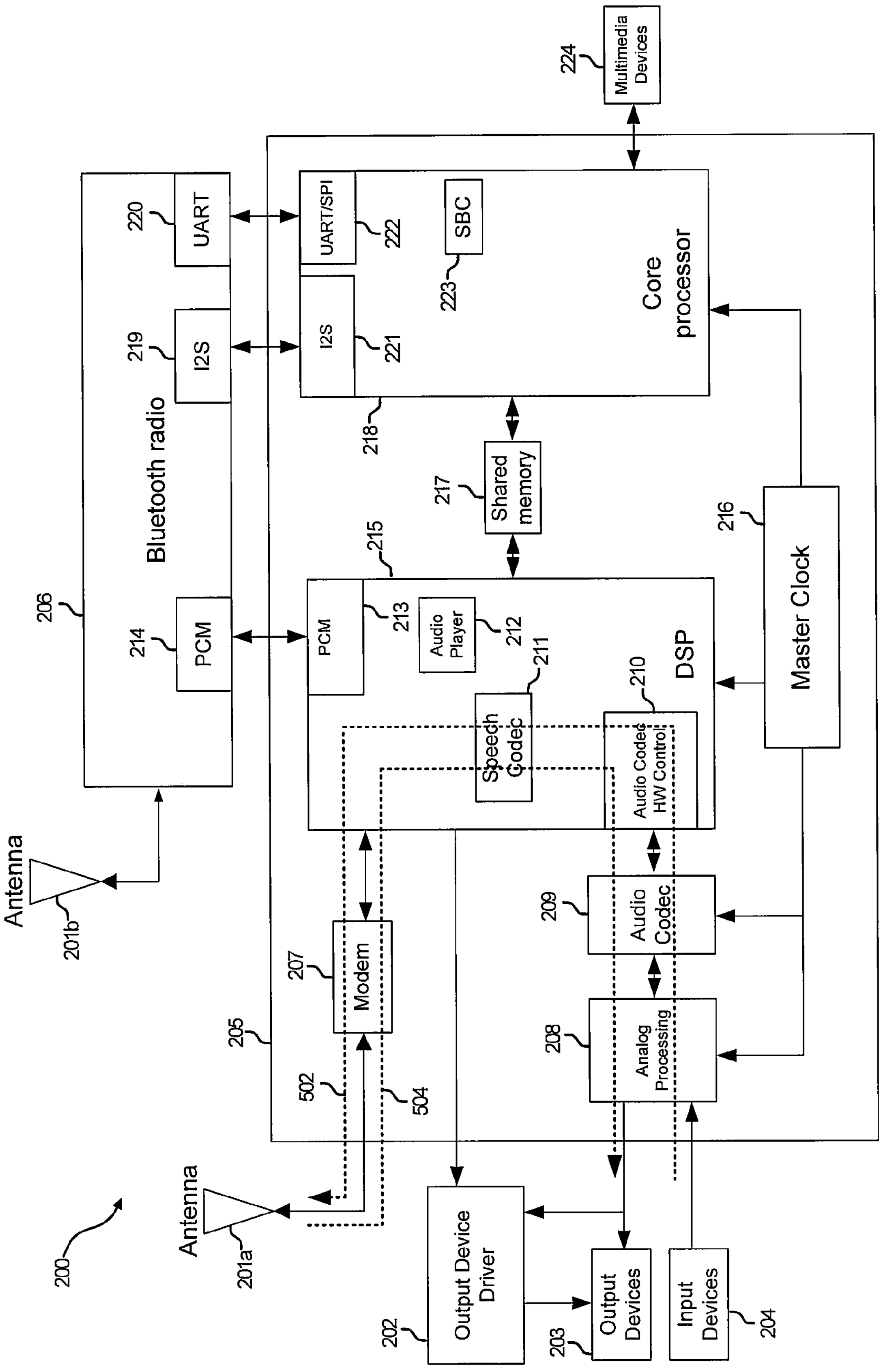
FIG. 5A is a block diagram illustrating an exemplary usage scenario for GSM voice, in accordance with an embodiment of the invention.

FIG. 5A is a block diagram illustrating an exemplary usage scenario for GSM voice, in accordance with an embodiment of the invention. Referring to FIG. 5A, there is shown an exemplary usage scenario where the wireless system 200 disclosed in FIG. 2A is utilized for GSM voice applications. In this exemplary usage scenario, a receive signal path, shown as signal path 504, may comprise receiving GSM voice signals via the antenna 201*a* communicatively coupled to the baseband processor 205. The signal path 504 may also comprise processing the GSM voice signals in the modem 207, the speech codec 211, the audio codec hardware control 210, the audio codec 209, and the analog processing unit 208. In this regard, the processing provided by the audio codec 209 and the analog processing unit 208 may be the same or substantially similar to the processing provided by the audio codec 230 disclosed in FIG. 2B and the audio processing unit 250 disclosed in FIG. 2C. The signal path 504 may also comprise communicating the analog voice signals generated by the analog processing unit 208 to the output devices 203.

Also in this exemplary usage scenario, a transmit signal path, shown as signal path 502, may be utilized to communicate analog voice signals generated by the input devices 204 to the analog processing unit 208 in the baseband processor 205. The signal path 502 may also be utilized for processing the voice signals in the audio codec 209, the audio codec hardware control 210, the speech codec 211, and the modem 207. In this regard, the processing provided by the audio codec 209 and the analog processing unit 208 may be the same or substantially similar to the processing provided by the audio codec 230 disclosed in FIG. 2B and the audio processing unit 250 disclosed in FIG. 2C. The signal path 502 may also be utilized to broadcast the processed voice signals via the antenna 201*a* by following the GSM communication protocol, for example. In this scenario, the audio codec 209 may be utilized to process voice signals without mixing of the voice signals with audio signals of any other source. Notwithstanding the exemplary usage scenario for GSM voice signals in the audio codec disclosed in FIG. 5A, aspects of the invention need not be so limited.

Figure 5B:
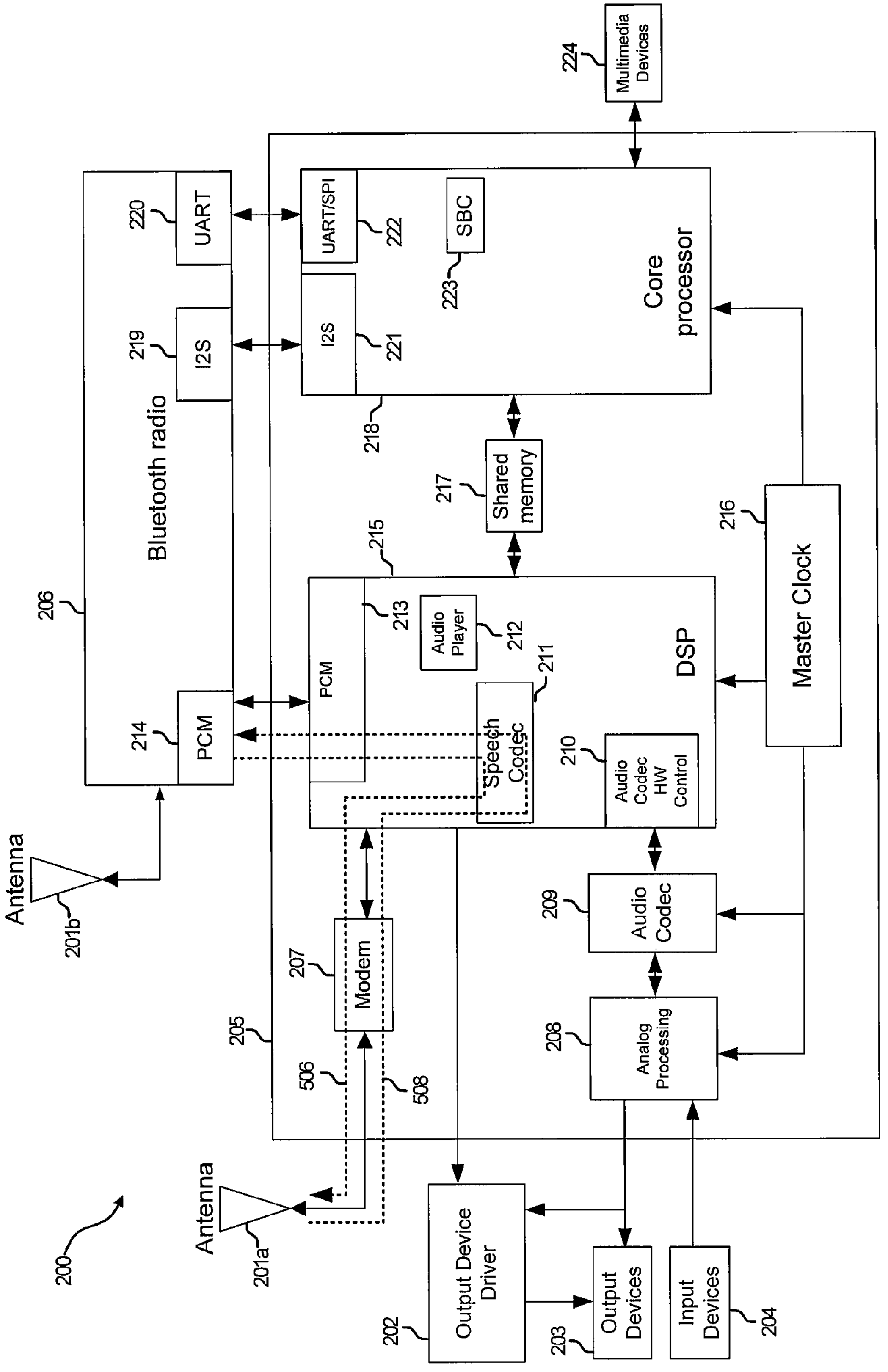
FIG. 5B is a block diagram illustrating an exemplary usage scenario for GSM voice via a Bluetooth radio, in accordance with an embodiment of the invention.

FIG. 5B is a block diagram illustrating an exemplary usage scenario for GSM voice via a Bluetooth radio, in accordance with an embodiment of the invention. Referring to FIG. 5B, there is shown an exemplary usage scenario where the wireless system 200 disclosed in FIG. 2A is utilized for GSM voice applications via the Bluetooth radio 206. In this exemplary usage scenario, a receive signal path, shown as signal path 508, may be utilized to receive GSM voice signals via the antenna 201*a* communicatively coupled to the baseband processor 205. The signal path 508 may also be utilized to process the GSM voice signals in the modem 207 and the speech codec 211. The signal path 508 may also be utilized to communicate the processed voice signals to the PCM block 214 in the Bluetooth radio 206 via the PCM block 213 in the DSP 215. In this usage scenario, the audio codec 209 and the analog processing unit 208 need not process the audio signals.

Also in this exemplary usage scenario, a transmit signal path, shown as signal path 506, may be utilized to communicate analog voice signals from the PCM block 214 in the Bluetooth radio 206 to the PCM block 213 in the DSP 215. The signal path 506 may also be utilized to process the voice signals in the speech codec 211 and the modem 207. The signal path 506 may also be utilized to broadcast the processed voice signals via the antenna 201*a* by following the GSM communication protocol, for example. In this usage scenario, the audio codec 209 and the analog processing unit 208 need not process the audio signals. Notwithstanding the exemplary usage scenario for GSM voice signals via the Bluetooth radio 206 disclosed in FIG. 5B, aspects of the invention need not be so limited.

Figure 5C:
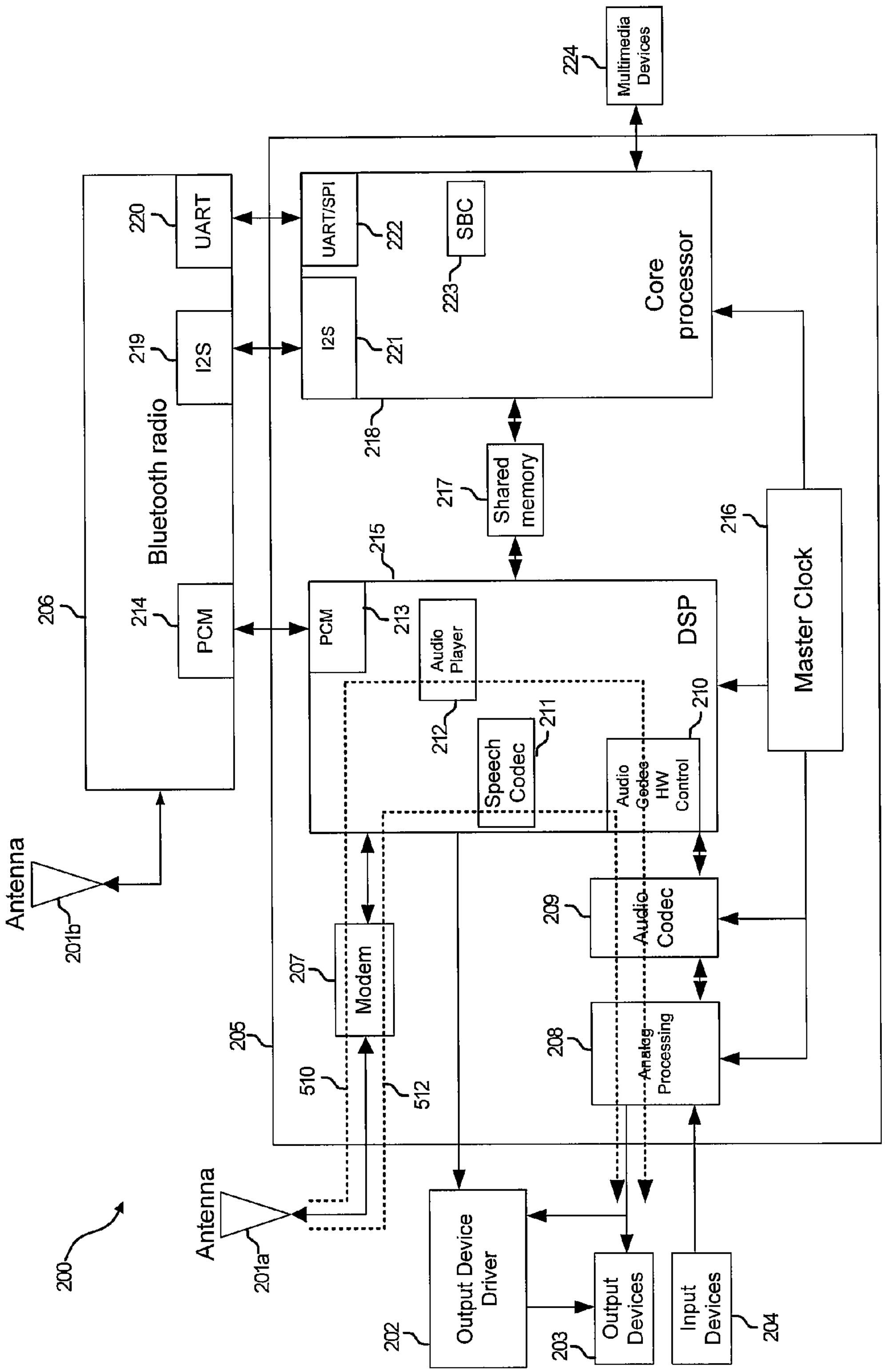
FIG. 5C is a block diagram illustrating an exemplary usage scenario for GSM voice and audio mixing, in accordance with an embodiment of the invention.

FIG. 5C is a block diagram illustrating an exemplary usage scenario for GSM voice and audio mixing, in accordance with an embodiment of the invention. Referring to FIG. 5C, there is shown an exemplary usage scenario where the wireless system 200 disclosed in FIG. 2A is utilized for GSM voice and audio mixing applications. In this exemplary usage scenario, there may be a voice receive signal path, shown as signal path 512, and an audio receive signal path, shown as signal path 510. The signal path 512 may be utilized to receive GSM voice signals via the antenna 201*a* communicatively coupled to the baseband processor 205. The signal path 512 may also be utilized to process the GSM voice signals in the modem 207, the speech codec 211, and the audio codec hardware control 210. The signal path 512 may also be utilized to mix the voice signals with audio signals from the signal path 510 in the audio codec 209 and processing the mixed signals in the analog processing unit 208. In this regard, the processing provided by the audio codec 209 and the analog processing unit 208 may be the same or substantially similar to the processing provided by the audio codec 230 disclosed in FIG. 2B and the audio processing unit 250 disclosed in FIG. 2C. The signal path 512 may also be utilized to communicate the mixed analog voice and audio signals generated by the analog processing unit 208 to the output devices 203.

Also in this exemplary usage scenario, the signal path 510 may be utilized to receive audio signals, such as music signals, for example, via the antenna 201*a* communicatively coupled to the baseband processor 205. The signal path 510 may also be utilized to process the audio signals in the modem 207, the audio player 212, and the audio codec hardware control 210. The signal path 510 may also be utilized to mix the audio signals with GSM voice signals from the signal path 512 in the audio codec 209 and processing the mixed signals in the analog processing unit 208. In this regard, the processing provided by the audio codec 209 and the analog processing unit 208 may be the same or substantially similar to the processing provided by the audio codec 230 disclosed in FIG. 2B and the audio processing unit 250 disclosed in FIG. 2C. The signal path 510 may also be utilized to communicate the mixed analog voice and audio signals generated by the analog processing unit 208 to the output devices 203. Notwithstanding the exemplary usage scenario for GSM voice and audio signal mixing in the audio codec disclosed in FIG. 5C, aspects of the invention need not be so limited.

Figure 5D:
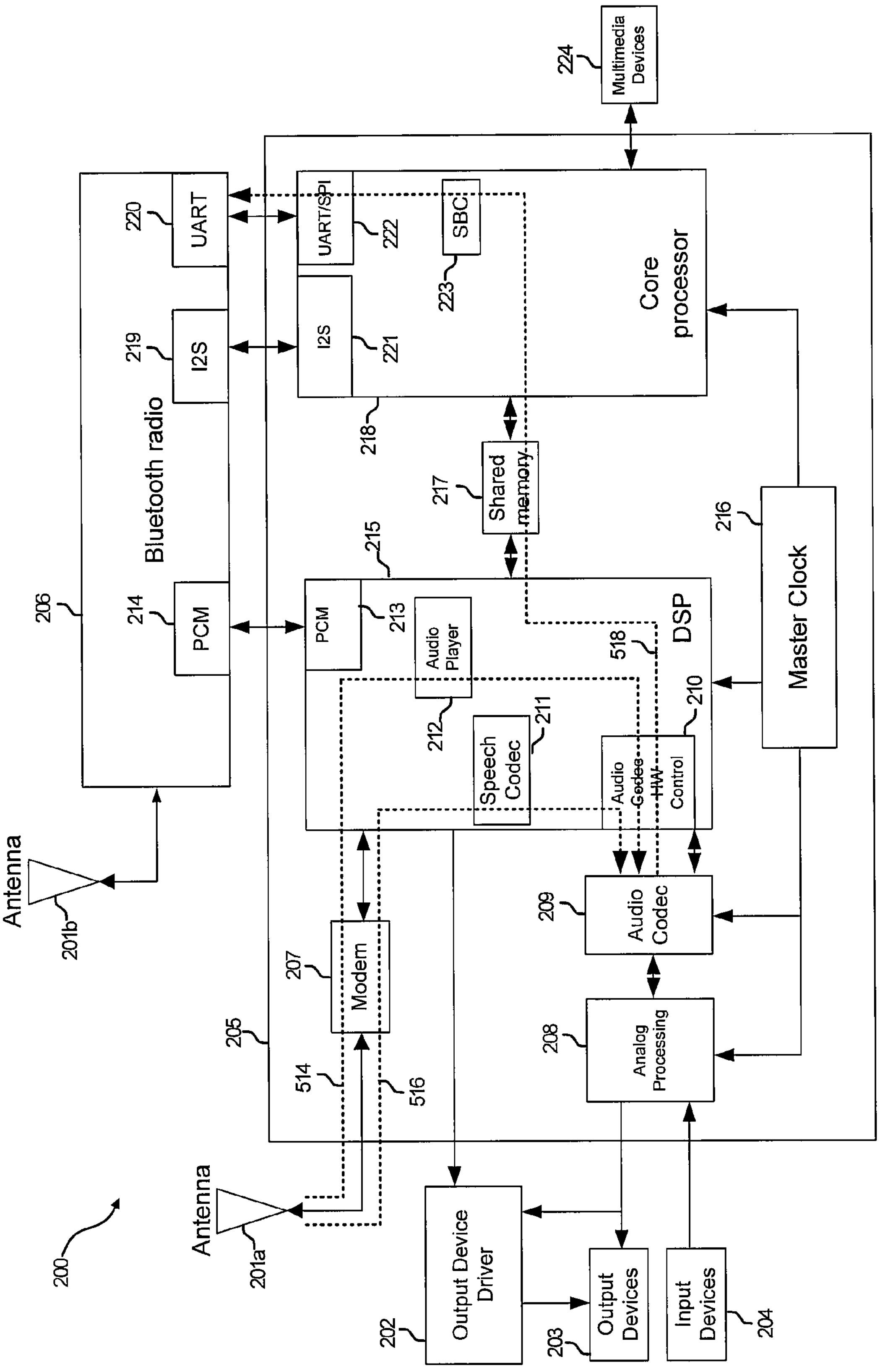
FIG. 5D is a block diagram illustrating an exemplary usage scenario for GSM voice and audio mixing via a Bluetooth radio, in accordance with an embodiment of the invention.

FIG. 5D is a block diagram illustrating an exemplary usage scenario for GSM voice and audio mixing via a Bluetooth radio, in accordance with an embodiment of the invention. Referring to FIG. 5D, there is shown an exemplary scenario where the wireless system 200 disclosed in FIG. 2A may be utilized for GSM voice and audio mixing applications via the Bluetooth radio 206. In this exemplary usage scenario, there may be a voice receive signal path, shown as signal path 516, an audio receive signal path, shown as signal path 514, and a mixed signal path, shown as signal path 518. The signal path 516 may be utilized to receive GSM voice signals via the antenna 201*a* communicatively coupled to the baseband processor 205. The signal path 516 may also be utilized to process the GSM voice signals in the modem 207, the speech codec 211, and the audio codec hardware control 210. The signal path 516 may also be utilized to mix the voice signals with audio signals from the signal path 514 in the audio codec 209. In this regard, the processing provided by the audio codec 209 may be the same or substantially similar to the processing provided by the audio codec 230 disclosed in FIG. 2B.

Also in this exemplary usage scenario, the signal path 514 may comprise receiving audio signals, such as music signals, for example, via the antenna 201*a* communicatively coupled to the baseband processor 205. The signal path 514 may also be utilized to process the audio signals in the modem 207, the audio player 212, and the audio codec hardware control 210. The signal path 514 may also be utilized to mix the audio signals with GSM voice signals from the signal path 516 in the audio codec 209. In this regard, the processing provided by the audio codec 209 and the analog processing unit 208 may be the same or substantially similar to the processing provided by the audio codec 230 disclosed in FIG. 2B.

Also in this exemplary usage scenario, the signal path 518 may be utilized to mix voice and audio signals generated by the audio codec 209 to the shared memory 217 and from the shared memory 217 to the SBC codec 223 in the core processor 218. The signal path 518 may also be utilized to communicate the output of the SBC codec 223 to the Bluetooth radio 206 via the UART/SPI 222 in the core processor 218 and the UART 220 in the Bluetooth radio 206. Notwithstanding the exemplary usage scenario for GSM voice and audio signal mixing in the audio codec via the Bluetooth radio disclosed in FIG. 5D, aspects of the invention need not be so limited.

In an embodiment of the invention, the audio codec disclosed in FIGS. 2A and 2B may be an integrated circuit in a wireless device that enables up sampling of two or more audio signals to a same data sampling rate. Each of the audio signals received within the integrated circuit may be received at a plurality of data sampling rates. The integrated circuit may also enables separately mixing of left and right channels of the up-sampled audio signals. Moreover, the integrated circuit may also enable up sampling of the mixed left and right channels for subsequent communication to an output device communicatively coupled to the integrated circuit. The audio signals may comprise digital audio data, digital voice data, and digital polyringer data, for example.

The integrated circuit may enable up sampling of the audio signals via at least one half-band interpolation operation. The integrated circuit may also enable down sampling of the up-sampled mixed left and right channels for communication to a Bluetooth radio. Dynamic adjustments to the gain of at least one of the left and right channels of the up-sampled audio signals may be performed by the integrated circuit. In this regard, where the integrated circuit may enable programming of a ramp-up or ramp-down to dynamically adjust the gain. The integrated circuit may also enable multi-band equalization of the audio signals prior to up sampling to a same data sampling rate. Moreover, the integrated circuit may enable selection of a finite impulse response (FIR) filter for compensation of the multi-band equalized audio signals prior to up sampling to a same data sampling rate.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:

up sampling within an integrated circuit in a wireless device, two or more audio signals to a same data sampling rate, wherein each of said audio signals is received within said integrated circuit at a plurality of data sampling rates;

separately mixing left and right channels of said up-sampled audio signals; and up sampling said mixed left and right channels for subsequent communication to an output device communicatively coupled to said integrated circuit.

2. The method according to claim 1, wherein said audio signals comprise digital audio data, digital voice data, and digital polyringer data.

3. The method according to claim 1, comprising up sampling said audio signals via at least one half-band interpolation operation.

4. The method according to claim 1, comprising down sampling said up-sampled mixed left and right channels for communication to a Bluetooth radio.

5. The method according to claim 1, comprising dynamically adjusting a gain on at least one of said left and right channels of said up-sampled audio signals.

6. The method according to claim 5, comprising programming a ramp-up or ramp-down of said dynamically adjusted gain.

7. The method according to claim 1, comprising multi-band equalizing of said audio signals prior to said up sampling to said same data sampling rate.

8. The method according to claim 7, comprising selecting a finite impulse response (FIR) filter for compensation of said multi-band equalized audio signals prior to said up sampling to said same data sampling rate.

9. A machine-readable storage having stored thereon, a computer program having at least one code section for signal processing, the at least one code section being executable by a machine for causing the machine to perform steps comprising:

up sampling within an integrated circuit in a wireless device, two or more audio signals to a same data sampling rate, wherein each of said audio signals is received within said integrated circuit at a plurality of data sampling rates;

separately mixing left and right channels of said up-sampled audio signals; and up sampling said mixed left and right channels for subsequent communication to an output device communicatively coupled to said integrated circuit.

10. The machine-readable storage according to claim 9, wherein said audio signals comprise digital audio data, digital voice data, and digital polyringer data.

11. The machine-readable storage according to claim 9, comprising up code for sampling said audio signals via at least one half-band interpolation operation.

12. The machine-readable storage according to claim 9, comprising code for down sampling said up-sampled mixed left and right channels for communication to a Bluetooth radio.

13. The machine-readable storage according to claim 9, comprising code for dynamically adjusting a gain on at least one of said left and right channels of said up-sampled audio signals.

14. The machine-readable storage according to claim 13, comprising code for programming a ramp-up or ramp-down of said dynamically adjusted gain.

15. The machine-readable storage according to claim 9, comprising code for multi-band equalizing of said audio signals prior to said up sampling to said same data sampling rate.

16. The machine-readable storage according to claim 15, comprising code for selecting a finite impulse response (FIR) filter for compensation of said multi-band equalized audio signals prior to said up sampling to said same data sampling rate.

17. A system for signal processing, the system comprising:

an integrated circuit for use in a wireless device that enables up sampling of two or more audio signals to a same data sampling rate, wherein each of said audio signals is received within said integrated circuit at a plurality of data sampling rates;

said integrated circuit enables separately mixing of left and right channels of said up-sampled audio signals; and said integrated circuit enables up sampling of said mixed left and right channels for subsequent communication to an output device communicatively coupled to said integrated circuit.

18. The system according to claim 17, wherein said audio signals comprise digital audio data, digital voice data, and digital polyringer data.

19. The system according to claim 17, wherein said integrated circuit enables up sampling of said audio signals via at least one half-band interpolation operation.

20. The system according to claim 17, wherein said integrated circuit enables down sampling of said up-sampled mixed left and right channels for communication to a Bluetooth radio.

21. The system according to claim 17, wherein said integrated circuit enables dynamic adjustment of a gain on at least one of said left and right channels of said up-sampled audio signals.

22. The system according to claim 21, wherein said integrated circuit enables programming of a ramp-up or ramp-down of said dynamically adjusted gain.

23. The system according to claim 17, wherein said integrated circuit enables multi-band equalization of said audio signals prior to said up sampling to said same data sampling rate.

24. The system according to claim 23, wherein said integrated circuit enables selection of a finite impulse response (FIR) filter for compensation of said multi-band equalized audio signals prior to said up sampling to said same data sampling rate.

25. A method for signal processing, the method comprising:

converting sampling rates of signals from a plurality of audio sources to a same sampling rate in two stages, wherein a first stage utilizes a plurality of upsample-by-two filters that reduces said sampling rates to a reduced set of sampling rates and a second stage utilizes an N-order polynomial interpolator to convert said reduced set of sampling rates to said same sampling rate.

26. The method according to claim 25, wherein said N-order polynomial interpolator is of order $N \leqq 4$.

27. The method according to claim 25, comprising substituting the operations of a first of said plurality of upsample-by-two filters with an IIR filter.

28. The method according to claim 27, comprising compensating said IIR filter to reduce latency.

* * * * *

UNITED STATES PATENT AND TRADEMARK OFFICE

CERTIFICATE OF CORRECTION

PATENT NO. : 7,463,170 B2 Page 1 of 1
APPLICATION NO. : 11/565414
DATED : December 9, 2008
INVENTOR(S) : Hongwei Kong et al.

It is certified that error appears in the above-identified patent and that said Letters Patent is hereby corrected as shown below:

Title Page, Item (75)
Inventors: Delete "Taiya" and insert --Taiyi--

Signed and Sealed this

Twelfth Day of May, 2009

JOHN DOLL
*Acting Director of the United States Patent and Trademark Office*